US011177633B1

(12) United States Patent
Wu et al.

(10) Patent No.: US 11,177,633 B1
(45) Date of Patent: Nov. 16, 2021

(54) MANUFACTURING METHOD OF A DEVICE FOR GENERATING TERAHERTZ RADIATION

(71) Applicant: National Taiwan University, Taipei (TW)

(72) Inventors: Chao-Hsin Wu, Taipei (TW); Shih-Kun Lin, Taichung (TW); Hsi-Han Chen, New Taipei (TW)

(73) Assignee: National Taiwan University, Taipei (TW)

( * ) Notice: Subject to any disclaimer, the term of this patent is extended or adjusted under 35 U.S.C. 154(b) by 8 days.

(21) Appl. No.: 16/939,053

(22) Filed: Jul. 26, 2020

(51) Int. Cl.
  *H01S 5/20* (2006.01)
  *H01S 5/323* (2006.01)
  *H01S 5/042* (2006.01)
  *H01S 5/12* (2021.01)

(52) U.S. Cl.
  CPC ............ *H01S 5/209* (2013.01); *H01S 5/0425* (2013.01); *H01S 5/12* (2013.01); *H01S 5/3235* (2013.01)

(58) Field of Classification Search
  CPC ..................................................... H01S 5/209
  USPC ........................................................ 438/32
  See application file for complete search history.

(56) References Cited

U.S. PATENT DOCUMENTS

| 9,236,711 B2* | 1/2016 | Park | .................... H01S 5/4031 |
| 2012/0068090 A1* | 3/2012 | Park | .................... H01S 5/4031 |
| | | | 250/493.1 |

* cited by examiner

*Primary Examiner* — Tuan N Nguyen
(74) *Attorney, Agent, or Firm* — Winston Hsu

(57) ABSTRACT

A manufacturing method of a device for generating terahertz radiation includes forming a distributed feedback laser epitaxy module; etching the distribution feedback laser epitaxy module corresponding to a first window to a predetermined depth; forming an indium gallium arsenide epitaxy layer above the distributed feedback laser epitaxy module corresponding to the first window; etching out the indium gallium arsenide epitaxy layer corresponding to a second window to expose the distributed feedback epitaxy module corresponding to the second window; forming a first electrode, a grating, and an antenna above an upper surface of the distributed feedback laser epitaxy module, an upper surface of the indium gallium arsenide epitaxy layer, and the distributed feedback laser epitaxy module corresponding to the second window, respectively; forming a second electrode above a lower surface of the distributed feedback laser epitaxy module; and forming two metal wires between the grating and the antenna.

11 Claims, 4 Drawing Sheets

MANUFACTURING METHOD OF A DEVICE FOR GENERATING TERAHERTZ RADIATION

BACKGROUND OF THE INVENTION

1. Field of the Invention

The present invention relates to a manufacturing method of a device, and particularly to a manufacturing method of a device for generating terahertz radiation.

2. Description of the Prior Art

In the prior art, a process of generating terahertz radiation usually includes using two laser sources to generate two laser beams, wherein frequencies of the two lasers beams are different; superimposing the two laser beams to generate interference and form a wave packet; inputting the wave packet to a photomixer; generating a photocurrent by the photomixer to an antenna after the photomixer receives the wave packet, wherein the photocurrent is an alternating current (AC) signal; outputting the terahertz radiation by the antenna according to the photocurrent. Therefore, a device performing the process provided by the prior art needs to include the two laser sources, the photomixer, and the antenna. However, because the device does not integrate the two laser sources, the photomixer, and the antenna, volume of the device is larger and loss occurs during transmission of the two laser beams. Therefore, how to highly integrate the two laser source, the photomixer, and the antenna to overcome the above-mentioned shortcomings of the device becomes an important issue of a designer of the device.

SUMMARY OF THE INVENTION

An embodiment of the present invention provides a manufacturing method of a device for generating terahertz radiation. The manufacturing method includes forming a distributed feedback laser epitaxy module; etching the distribution feedback laser epitaxy module corresponding to a first window defined by a first photoresist to a predetermined depth; forming an indium gallium arsenide epitaxy layer above the distributed feedback laser epitaxy module corresponding to the first window, wherein an upper surface of the indium gallium arsenide epitaxy layer is aligned with an upper surface of the distribution feedback laser epitaxy module; etching out the indium gallium arsenide epitaxy layer corresponding to a second window defined by a second photoresist to expose the distributed feedback epitaxy module corresponding to the second window; forming a first electrode, a grating, and an antenna above an upper surface of the distributed feedback laser epitaxy module, an upper surface of the indium gallium arsenide epitaxy layer, and the distributed feedback laser epitaxy module corresponding to the second window, respectively; forming a second electrode above a lower surface of the distributed feedback laser epitaxy module; and forming two metal wires between the grating and the antenna.

In another embodiment of the present invention, the distribution feedback laser epitaxy module comprises an N-type indium phosphide (InP) layer, a quantum well, and a P-type indium phosphide layer, wherein the quantum well is formed above the N-type indium phosphide layer, and the P-type indium phosphide layer is formed above the quantum well.

In another embodiment of the present invention, the predetermined depth is within the N-type indium phosphide layer.

In another embodiment of the present invention, the quantum well comprises a semiconductor material for generating laser with two modes, and the semiconductor material is indium gallium arsenide phosphide (InGaAsP) or indium gallium aluminum arsenide (InGaAlAs).

In another embodiment of the present invention, the first photoresist and the second photoresist are the same or different.

In another embodiment of the present invention, the lower surface of the distribution feedback laser epitaxy module corresponding to the second electrode corresponds to the upper surface of the distribution feedback laser epitaxy module corresponding to the first electrode.

In another embodiment of the present invention, a material of the two metal wires is gold.

In another embodiment of the present invention, a material of the first electrode is titanium, or platinum, or gold.

In another embodiment of the present invention, a material of the second electrode is gold, or germanium, or nickel.

In another embodiment of the present invention, a material of the grating is gold.

In another embodiment of the present invention, a material of the antenna is gold.

The present invention provides a manufacturing method of a device for generating terahertz radiation. The manufacturing method of the device for generating the terahertz radiation can highly integrate two laser sources, a photomixer, and an antenna into a single element.

Therefore, compared to the prior art, because the manufacturing method can integrate the device into the single element, the present invention can effectively solve the shortcomings of larger volume and much loss of the prior art.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
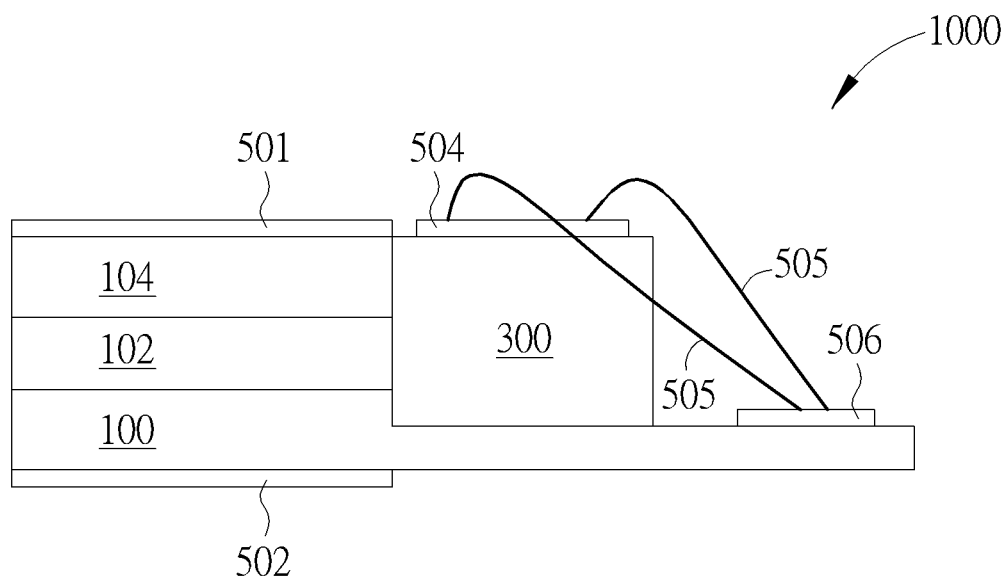
FIG. 1A is a diagram illustrating a side view of a device for generating terahertz radiation according to a first embodiment of the present invention.
Figure 1B:
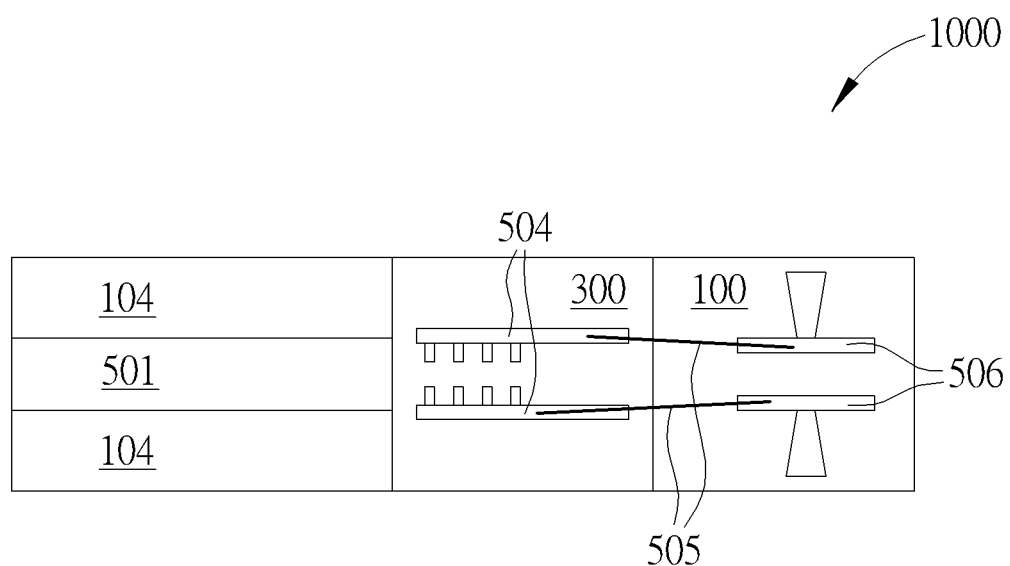
FIG. 1B is a diagram illustrating a top view of the device for generating terahertz radiation.

Please refer to FIG. 1A, 1B. FIG. 1A is a diagram illustrating a side view of a device 1000 for generating terahertz radiation according to a first embodiment of the present invention, and FIG. 1B is a diagram illustrating a top view of the device 1000. As shown in FIG. 1A, the device 1000 includes a distributed feedback laser epitaxy module 10, an indium gallium arsenide epitaxy layer 300, a first electrode 501, a grating 504, an antenna 506, a second electrode 502, and two metal wires 505. The distributed feedback laser epitaxy module 10 includes an N-type indium phosphide (InP) layer 100, a quantum well 102, and a P-type indium phosphide layer 104, wherein the quantum well 102 is formed above the N-type indium phosphide layer 100, and the P-type indium phosphide layer 104 is formed above the quantum well 102. In addition, the quantum well 102 includes a semiconductor material for generating a laser beams with two modes (that is, two wavelengths), and the semiconductor material includes indium gallium arsenide phosphide (InGaAsP) or indium gallium aluminum arsenide (InGaAlAs). In addition, a material of the first electrode 501 is titanium, or platinum, or gold, a material of the second electrode 502 is gold, or germanium, or nickel, a material of the grating 504 is gold, a material of the antenna 506 is gold, and a material of the two metal wires 505 is gold.

Figure 2:
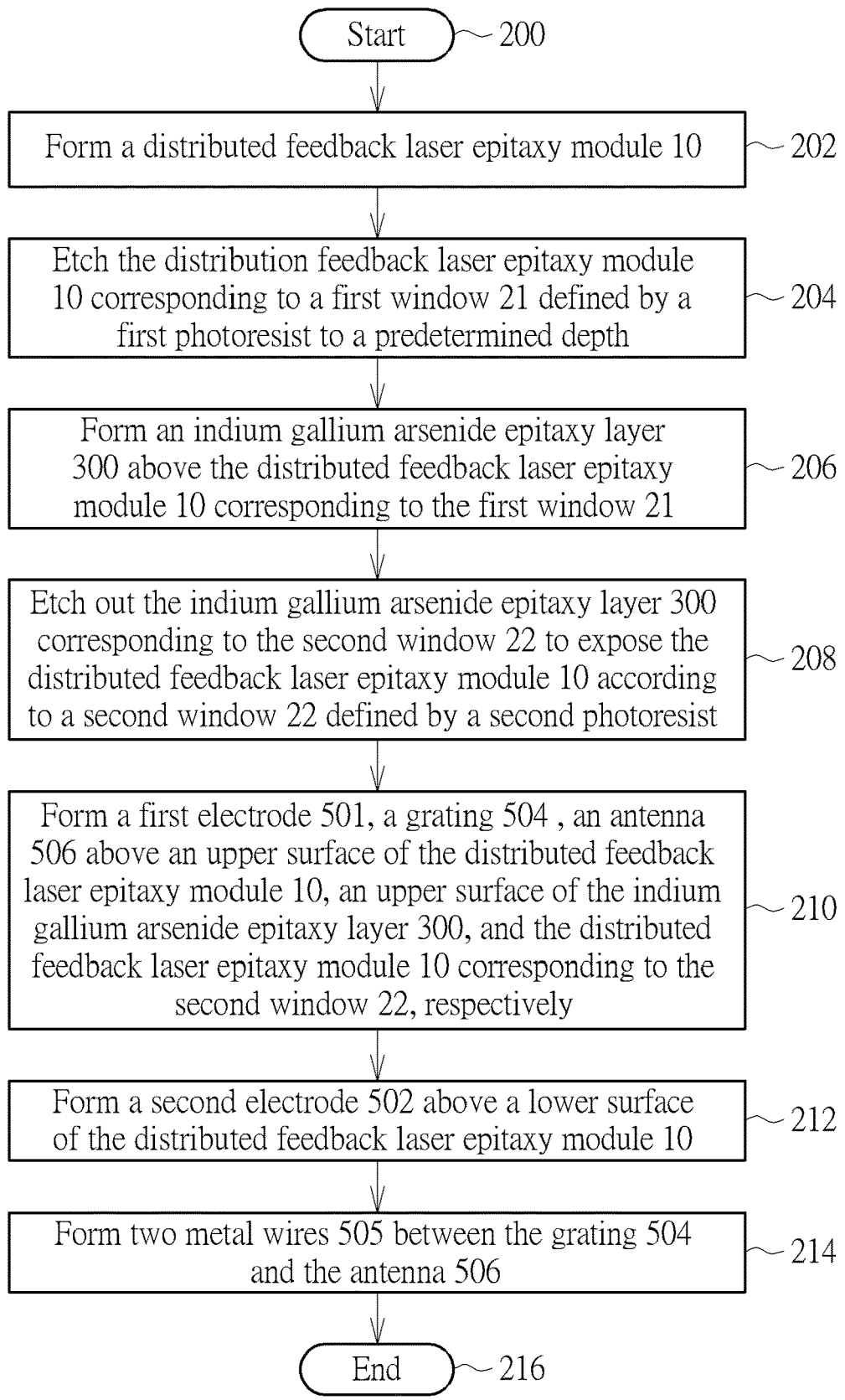
FIG. 2 is a flowchart illustrating a manufacturing method of the device for generating terahertz radiation according to a second embodiment of the present invention.
Figure 3:
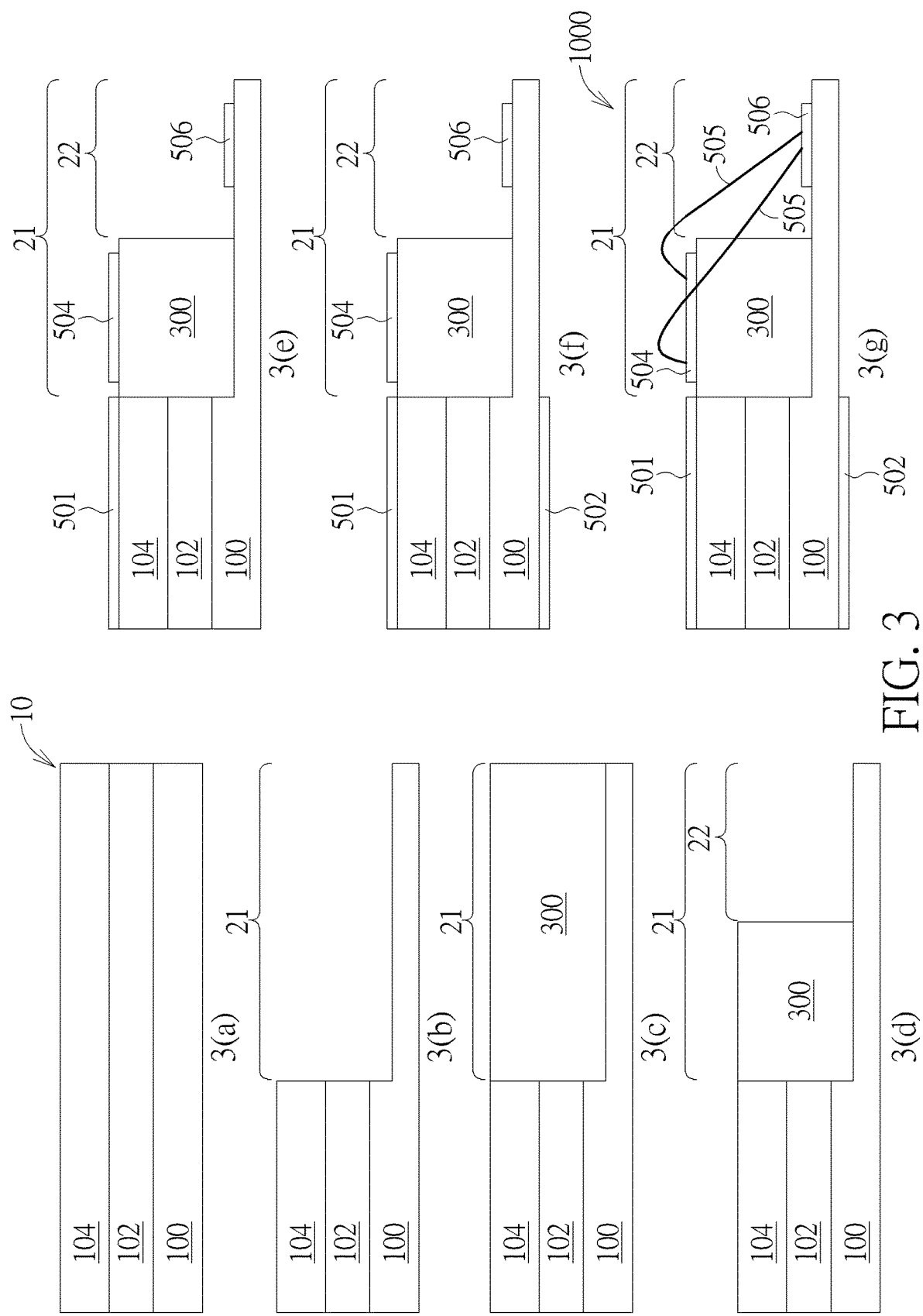
FIG. 3 is a diagram utilizing a side view to illustrate the manufacturing method in FIG. 2.
Figure 4:
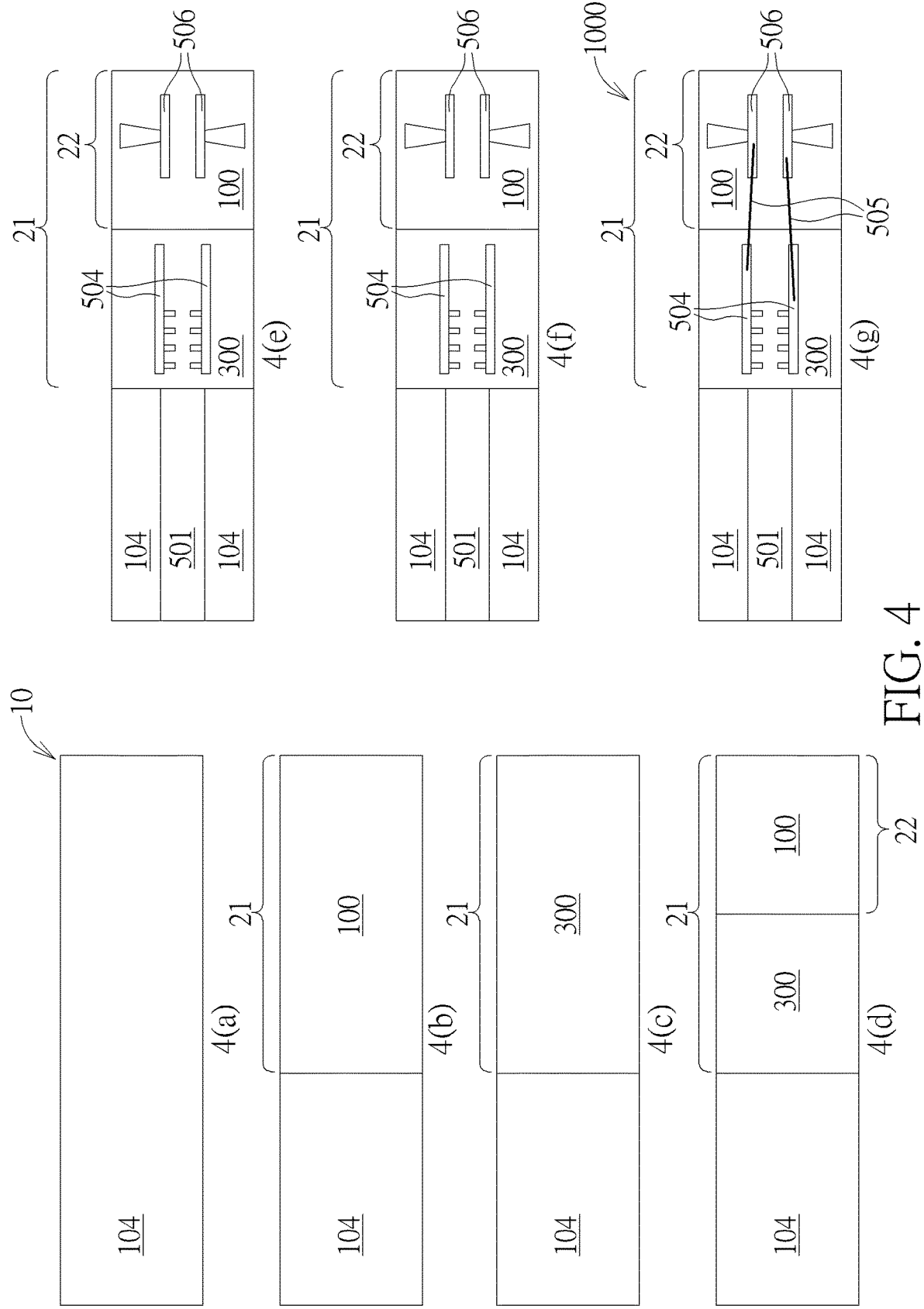
FIG. 4 is a diagram utilizing a top view to illustrate the manufacturing method in FIG. 2.

Please refer to FIG. 2. FIG. 2 is a flowchart illustrating a manufacturing method of the device 1000 for generating terahertz radiation according to a second embodiment of the present invention, wherein the manufacturing method in FIG. 2 can refer to FIG. 3, 4. FIG. 3 is a diagram utilizing a side view to illustrate the manufacturing method in, and FIG. 4 is a diagram utilizing a top view to illustrate the manufacturing method in FIG. 2. In addition, FIG. 3(a)-3(g) correspond to Steps 202-214 in FIG. 2 respectively, and FIG. 4(a)-4(g) correspond to Steps 202-214 in FIG. 2 respectively. The detailed steps of the manufacturing method in FIG. 2 are as follows:

Step 200: Start.

Step 202: Form a distributed feedback laser epitaxy module 10.

Step 204: Etch the distribution feedback laser epitaxy module 10 corresponding to a first window 21 defined by a first photoresist to a predetermined depth.

Step 206: Form an indium gallium arsenide epitaxy layer 300 above the distributed feedback laser epitaxy module 10 corresponding to the first window 21.

Step 208: Etch out the indium gallium arsenide epitaxy layer 300 corresponding to the second window 22 to expose the distributed feedback laser epitaxy module 10 according to a second window 22 defined by a second photoresist.

Step 210: Forma first electrode 501, a grating 504, an antenna 506 above an upper surface of the distributed feedback laser epitaxy module 10, an upper surface of the indium gallium arsenide epitaxy layer 300, and the distributed feedback laser epitaxy module 10 corresponding to the second window 22, respectively.

Step 212: Form a second electrode 502 above a lower surface of the distributed feedback laser epitaxy module 10.

Step 214: Form two metal wires 505 between the grating 504 and the antenna 506.

Step 216: End.

In step 202, as shown in FIG. 3(a) and FIG. 4(a), forming the distributed feedback laser epitaxy module 10 is well-known to one of ordinary skill in the art, so further description thereof is omitted for simplicity.

In step 204, as shown in FIG. 3(b) and FIG. 4 (b), the predetermined depth is within the N-type indium phosphide layer 100.

In step 206, as shown in FIG. 3(c) and FIG. 4(c), the indium gallium arsenide epitaxy layer 300 is formed above the distributed feedback laser epitaxy module 10 (that is, N-type indium phosphide layer 100) corresponding to the first window 21, wherein the upper surface of the indium gallium arsenide epitaxy layer 300 is aligned with an upper surface of the distribution feedback laser epitaxy module 10.

In step 208, as shown in FIG. 3(d) and FIG. 4(d), according to the second window 22 defined by the second photoresist, the indium gallium arsenide epitaxy layer 300 corresponding to the second window 22 is etched out to expose the distributed feedback laser epitaxy module 10 (that is, N-type indium phosphide layer 100), wherein the first photoresist and the second photoresist are the same or different.

In step 210, as shown in FIG. 3(e) and FIG. 4(e), the first electrode 501, the grating 504, the antenna 506 are formed above the upper surface of the distributed feedback laser epitaxy module 10, the upper surface of the indium gallium arsenide epitaxy layer 300, and the distributed feedback laser epitaxy module 10 corresponding to the second window 22, respectively.

In step 212, as shown in FIG. 3(f) and FIG. 4(f), the second electrode 502 is formed above the lower surface of the distributed feedback laser epitaxy module 10, wherein the lower surface of the distribution feedback laser epitaxy module 10 corresponding to the second electrode 502 corresponds to the upper surface of the distribution feedback laser epitaxy module 10 corresponding to the first electrode 501.

In step 214, as shown in FIG. 3(g) and FIG. 4(g), the two metal wires 505 are formed between the grating 504 and the antenna 506.

Please further refer to FIG. 1A, 1B. In the device 1000, the distributed feedback laser epitaxy module 10 not corresponding to the first window 21 and the second window 22 can simulate a dual-mode distributed feedback laser (i.e. two laser sources). After a current is applied between the first electrode 501 and the second electrode 502, the current will be inputted to the distributed feedback laser epitaxy module 10 not corresponding to the first window 21 and the second window 22 to make the distributed feedback laser epitaxy module 10 not corresponding to the first window 21 and the second window 22 generate a laser beam including the two modes (that is, two wavelengths), wherein the laser beam including the two modes is inputted to the indium gallium arsenide epitaxy layer 300 corresponding to the first window 21 and not corresponding to the second window 22. Because the indium gallium arsenide epitaxy layer 300 is a photoconductor, the laser beam including the two modes can be converted to a photocurrent by the indium gallium arsenide epitaxy layer 300, and the photocurrent can be captured by the grating 504 and be transmitted to the antenna 506 through the two metal wires 505. Then, the antenna 506 can generate the terahertz radiation according to the photocurrent, and output the terahertz radiation. In addition, the indium gallium arsenide epitaxy layer 300 corresponding to the first window 21 and not corresponding to the second window 22 and the grating 504 can simulate a photomixer.

In addition, because FIG. 4 is the diagram utilizing the top view to illustrate the manufacturing method in FIG. 2, FIG. 4 (a) only shows the P-type indium phosphide layer 104. In FIG. 4 (b), because the P-type indium phosphide layer 104 corresponding to the first window 21 and the quantum well 102 corresponding to the first window 21 are etched out, the N-type indium phosphide layer 100 corresponding to the first window 21 is exposed. In FIG. 4 (d), because the indium gallium arsenide epitaxy layer 300 corresponding to the second window 22 is etched out, the N-type indium phosphide layer 100 corresponding to the second window 22 is exposed. In FIG. 4 (f), because the second electrode 502 is formed above the lower surface of the distributed feedback laser epitaxy module 10, wherein the lower surface of the distribution feedback laser epitaxy module 10 corresponding to the second electrode 502 corresponds to the upper surface of the distribution feedback laser epitaxy module 10 corresponding to the first electrode 501, the second electrode 502 cannot be seen in FIG. 4 (*f*).

To sum up, the manufacturing method of the device for generating the terahertz radiation can highly integrate the dual-mode distributed feedback laser (the two laser sources), the photomixer, and the antenna into a single element. Therefore, compared to the prior art, because the manufacturing method can integrate the device into the single element, the present invention can effectively solve the shortcomings of larger volume and much loss of the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a device for generating terahertz radiation, comprising:
    forming a distributed feedback laser epitaxy module;
    etching the distribution feedback laser epitaxy module corresponding to a first window defined by a first photoresist to a predetermined depth;
    forming an indium gallium arsenide epitaxy layer above the distributed feedback laser epitaxy module corresponding to the first window, wherein an upper surface of the indium gallium arsenide epitaxy layer is aligned with an upper surface of the distribution feedback laser epitaxy module;
    etching out the indium gallium arsenide epitaxy layer corresponding to a second window defined by a second photoresist to expose the distributed feedback epitaxy module corresponding to the second window;
    forming a first electrode, a grating, and an antenna above an upper surface of the distributed feedback laser epitaxy module, an upper surface of the indium gallium arsenide epitaxy layer, and the distributed feedback laser epitaxy module corresponding to the second window, respectively;
    forming a second electrode above a lower surface of the distributed feedback laser epitaxy module; and
    forming two metal wires between the grating and the antenna.

2. The manufacturing method of claim 1, wherein the distribution feedback laser epitaxy module comprises an N-type indium phosphide (InP) layer, a quantum well, and a P-type indium phosphide layer, wherein the quantum well is formed above the N-type indium phosphide layer, and the P-type indium phosphide layer is formed above the quantum well.

3. The manufacturing method of claim 2, wherein the predetermined depth is within the N-type indium phosphide layer.

4. The manufacturing method of claim 2, wherein the quantum well comprises a semiconductor material for generating laser with two modes, and the semiconductor material is indium gallium arsenide phosphide (InGaAsP) or indium gallium aluminum arsenide (InGaAlAs).

5. The manufacturing method of claim 1, wherein the first photoresist and the second photoresist are the same or different.

6. The manufacturing method of claim 1, wherein the lower surface of the distribution feedback laser epitaxy module corresponding to the second electrode corresponds to the upper surface of the distribution feedback laser epitaxy module corresponding to the first electrode.

7. The manufacturing method of claim 1, wherein a material of the two metal wires is gold.

8. The manufacturing method of claim 1, wherein a material of the first electrode is titanium, or platinum, or gold.

9. The manufacturing method of claim 1, wherein a material of the second electrode is gold, or germanium, or nickel.

10. The manufacturing method of claim 1, wherein a material of the grating is gold.

11. The manufacturing method of claim 1, wherein a material of the antenna is gold.

* * * * *